(12) United States Patent
Stocker et al.

(10) Patent No.: US 6,224,459 B1
(45) Date of Patent: May 1, 2001

(54) WORKPIECE INSPECTION AND HANDLING

(75) Inventors: Mark Andrew Stocker, West Hunsbury; Dermot Robert Falkner, Skipton; Paul Martin Howard Morantz, Newport Pagnell; Michael George Pierse, Bedford, all of (GB)

(73) Assignee: Unova U.K. Limited, Aylesbury (GB)

( * ) Notice: Subject to any disclaimer, the term of this patent is extended or adjusted under 35 U.S.C. 154(b) by 0 days.

(21) Appl. No.: 09/202,752

(22) PCT Filed: Jun. 11, 1997

(86) PCT No.: PCT/GB97/01570

§ 371 Date: Dec. 15, 1998

§ 102(e) Date: Dec. 15, 1998

(87) PCT Pub. No.: WO97/48525

PCT Pub. Date: Dec. 24, 1997

(30) Foreign Application Priority Data

Jun. 15, 1996 (GB) .................................................. 9612594
Dec. 19, 1996 (GB) .................................................. 9626397
Dec. 19, 1996 (GB) .................................................. 9626415

(51) Int. Cl.$^7$ .................................................. B24B 49/00
(52) U.S. Cl. .................................. 451/5; 451/6; 451/43; 451/44
(58) Field of Search ................................ 451/5, 6, 43, 44

(56) References Cited

U.S. PATENT DOCUMENTS 4,638,601 * 1/1987 Steere et al. ............................. 451/5
4,794,736 * 1/1989 Fuwa et al. ............................. 451/6

FOREIGN PATENT DOCUMENTS

04505790A2 * 10/1991 (EP) ................................ B23Q/7/14
0589160A1 * 3/1994 (EP) ................................ B24B/47/22

* cited by examiner

Primary Examiner—David A. Scherbel
Assistant Examiner—Shantese McDonald
(74) Attorney, Agent, or Firm—Lee, Mann, Smith, McWilliams, Sweeney & Ohlson

(57) ABSTRACT

A workpiece alignment and shifting system for moving circular workpieces from a first inspection station to a second machining station, comprises workpiece holding means for attachment to the face of a disc workpiece to move the latter from one position to another. Robotic means controls the position of the workpiece holding means and is adapted to move in a least two orthogonal directions, both of which are parallel to the plane of the disc when it occupies the first station. The disc is rotated in the inspection station and in the machining station and inspection means determines the position of the geometric center of the disc as it is rotated. Computing means calculates from data delivered by the inspection means the two shifts required along the orthogonal directions of movement of the robotic means, to move the geometric center of the disc to a second desired position whose coordinates are known. The computing means includes memory means for storing the said coordinates. The coordinates are those of the center of rotation of the workpiece holder or chuck in the said second station. The workpiece holding means is vacuum operated. A three axis robot is employed to pick and place disc-like wafers of semi-conductor material for edge grinding, and movement along two of the robot axes, X and Z, is used to control the centering of the wafer on a vacuum chuck in the second grinding station.

27 Claims, 6 Drawing Sheets

| COL / ROW | 1 | 2 | 3 | 4 | 5 | 6 | 7 | 8 | 9 | 10 |
|---|---|---|---|---|---|---|---|---|---|---|
| COL 1 | 0 | 0 | 0 | 0 | 0 | 0 | 0 | 0 | 0 | 2 |
| COL 2 | 5 | 2 | 0 | 0 | 0 | 0 | 1 | 4 | 7 | 9 |
| COL 3 | 10 | 9 | 8 | 8 | 8 | 7 | 9 | 10 | 10 | 10 |
| COL 4 | 10 | 10 | 10 | 10 | 10 | 10 | 10 | 10 | 10 | 10 |

| COL / ROW | 1 | 2 | 3 | 4 | 5 | 6 | 7 | 8 | 9 | 10 |
|---|---|---|---|---|---|---|---|---|---|---|
| COL 1 | 0 | 0 | 0 | 0 | 0 | 0 | 0 | 0 | 0 | 0 |
| COL 2 | 2 | 0 | 0 | 0 | 0 | 0 | 0 | 2 | 4 | 8 |
| COL 3 | 9 | 7 | 5 | 4 | 5 | 6 | 8 | 9 | 10 | 10 |
| COL 4 | 10 | 10 | 10 | 10 | 10 | 10 | 10 | 10 | 10 | 10 |
Fig. 8
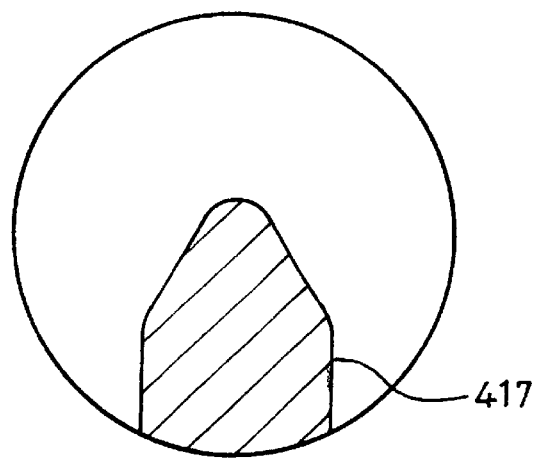
Fig. 9
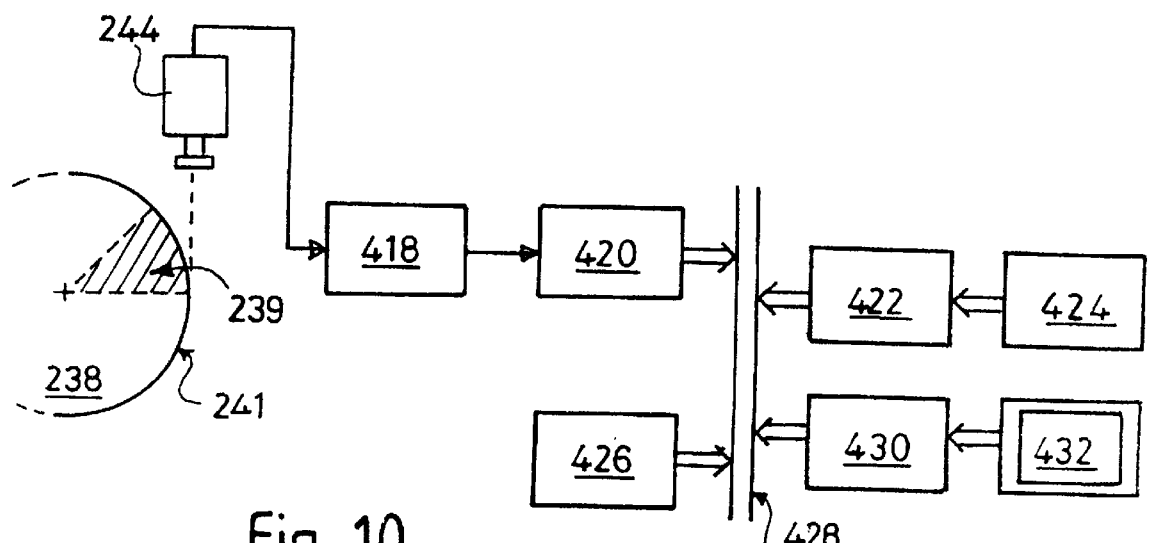
Fig. 10

WORKPIECE INSPECTION AND HANDLING

FIELD OF THE INVENTION

This invention concerns apparatus and methods for inspecting circular workpieces such as disc-like wafers of semi conductor material, prior to and after machining. The invention is applicable to apparatus and methods of grinding the edge of such a workpiece, and assists in placement of the wafer on a grinding chuck, adjustment of machining tools, and checking the accuracy of the machined edge.

BACKGROUND OF THE INVENTION

U.S. Pat. No. 4,638,601 describes a system for rotating a circular disc in a first station so as to align the disc in a particular manner so that it can then be transferred linearly without rotation into a second station for mounting on a vacuum chuck for machining. In the first station the disc is rotated so as to determine any eccentricity of the disc relative to the centre about which it is rotated, and this eccentricity is then aligned with the linear transfer path. Having achieved this alignment the centre about which the disc was rotating and the geometric centre of the disc are now aligned with the transfer axis. By so aligning the disc, any error in placement at the first station (which typically can be of the order of a few millimeters) as between the geometric centre and the actual axis of rotation in the first station, is converted into an adjustment in the linear shift along the path from the one station to the other. This enables the disc to be centred accurately at the second station so that the geometric centre of the disc is aligned with the axis of rotation of the vacuum chuck in the second station, thereby enabling accurate grinding of the edge of the disc by a grinding wheel.

There are many situations in which this type of placement is insufficient, since it does not allow discs to be positioned at the second station so as to accommodate all desired forms of rotation and grinding. Thus for example it may be desirable actually to mount the disc eccentrically relative so as to accommodate a damaged region of the periphery of the disc. By locating the disc so that a damaged region is at a greater radius from the geometric centre than is the undamaged remainder of the periphery and rotating the disc about the eccentric axis, a new disc is formed, albeit slightly smaller than the original disc, but in which the damaged region is ground away in the process. The eccentric axis about which the disc is rotated in the second station eventually, on completion of the grinding becomes the geometric centre of the new disc, formed by the grinding process.

Where an alignment method is employed such as disclosed in U.S. Pat. No. 4,638,601, there are only 2 chances in 360 that a damaged peripheral region will lie at one end or the other of the diameter of the original disc which has to be aligned with the transfer path in the prior art method.

It is and object of the invention to provide a workpiece alignment and shifting system which enables a disc to be mounted in the second station for rotation about any chosen axis.

It is to be understood that, the invention is not limited to situations in which the edge of the disc is damaged, but can of course be employed in all situations, provided (as intended), it is possible to mount the disc for rotation about any axis (including the geometric centre of the disc).

SUMMARY OF THE INVENTION

In accordance with one aspect of the invention a workpiece alignment and shifting system for moving circular workpieces from a first inspection station to a second machining station, comprises workpiece holding means for attachment to the face of a disc workpiece to move the latter from one position to another, robotic means controlling the position of the workpiece holding means and adapted to move in at least two orthogonal directions, both of which are parallel to the plane of the disc when it occupies the first station, means for rotating the disc in the inspection station and in the machining station, inspection means for determining the position of the geometric centre of the disc as it is rotated in the first station, and computing means for calculating from data delivered by the inspection means the two shifts required along the orthogonal directions of movement of the robotic means, to move the geometric centre of the disc to a second desired position whose co-ordinates are known.

Preferably the computing means includes memory means for storing the said co-ordinates.

Preferably the means for rotating the disc workpiece in each of the first and second stations comprises a vacuum chuck and motor means associated therewith.

Preferably the workpiece holding means is vacuum operated.

Typically the co-ordinated are those of the centre of rotation of the workpiece holder or chuck in the said second station.

Preferably the computing means is adapted to compute the translation needed to shift the disc workpiece from the first station along one, or other, or all three, of three orthogonal axes, so as to position the disc with its geometric centre coincident with the axis of rotation of the chuck in the second station, or with the said geometric centre of the disc displaced from the axis of rotation of the chuck by a desired known distance and angular orientation.

By displacing the geometric centre of the disc relative to the axis of rotation of the second chuck, so a particular eccentricity, equal to the said displacement and initial orientation will be introduced into the rotation of the disc, thereby enabling it to be ground so as to shift the geometric centre to a new position determined by the said displacement.

In a preferred embodiment of the invention a three axis robot is employed to pick and place disc-like wafers of semi-conductor material for edge grinding. Movement along two of the robot axes, X and Z is used to control the centering of the wafer on a vacuum chuck in the second grinding station.

In one method according the invention the wafer is places in the inspection station so that its geometric centre aligns approximately with the axis of rotation of the inspection station, the wafer is rotated around the inspection station axis and two dimensions X1 and Z1 are computed, these being the distances, measured parallel to the X and Z axes, through which the geometric centre of the wafer needs to be shifted to coincide with the centre of rotation of the inspection station, and using the robot, the wafer is then transferred to a grinding chuck and is positioned thereon by making compensations in the X and Z directions so as to position the (now) known geometric centre of the wafer accurately relative to the axis of rotation of the grinding chuck.

This method does not require the wafer to be rotated so that the line joining the axis of rotation of the inspection station to the geometric centre of the wafer is parallel to the robot X axis, in order to make the compensation, as is required in the method described in U.S. Pat. No. 4,638,601.

Since it is now possible to shift the wafer so as to move the geometric centre thereon to any desired position relative to the axis of rotation of the grinding chuck, the X and Z adjustments incorporated in the transfer from the first inspection station to the second grinding station chuck, allows a "best fit" compromise between centering the wafer on the grinding chuck and unnecessarily removing material from the notch. Furthermore where damage is identified around the periphery of the wafer, the method allows the deliberate eccentric placement of the wafer on the grinding station chuck so that where peripheral damage has occurred as during slicing, the wafer can be re-ground about a new centre, so as to remove the unwanted damaged peripheral region. No such facility exists in general with a single axis shifting system as described in the aforementioned US Patent.

It is of course possible to rotate the disc to any desired orientation by rotating the vacuum chuck in the inspection station and transferring the disc at that orientation to the workhead.

According to another aspect of the invention, the exact distances measured parallel to the X and Z axes between the inspection station axis of rotation and the grinding station chuck axis of rotation, can be computed in accordance with a further method which arises from the use of a multiple axis robot.

In this method the X and Z co-ordinates of both the inspection station axis and the grinding chuck axis are first determined to a first approximation and stored, thereafter a circular wafer is picked up by the holding means and is placed on the inspection chuck and rotated so as to determine the geometric centre thereof in manner know per se, the wafer is then transferred back to the holding means and adjustments are made in the X and Z directions so as to centre the wafer relative to the inspection station axis so that the geometric centre is now correctly aligned with the axis of rotation of the inspection station and the X and Z co-ordinates at that aligned position noted, the robot is then instructed to move the wafer from that position to the grinding station chuck so as to position the centre of the wafer on the axis of rotation of the grinding chuck by making the two previously computed shifts parallels to the X and Z axes to achieve transfer from the inspection station axis to the grinding chuck axis, whereafter the wafer is then rotated through 180° by the grinding chuck, transferred from the grinding chuck back to the holding means and returned to the inspection station by retracing the movements previously executed to achieve the first transfer, back to the noted co-ordinates, so that the wafer can be transferred once more from the holding means back to the inspection station chuck, and lastly the wafer is rotated in the inspection station and rechecked (in manner known per se) for any eccentricity (ie. displacement of its geometric centre relative to the axis of rotation in the inspection station).

Any eccentricity noted can be converted into displacements along the X and Z axis and these values can be added to (or subtracted from as the case may be), the previously computed X and Z shifts computed as necessary to move between the noted co-ordinates position of the inspection station axis and the grinding chuck axis, to thereby determine the exact distances (measured parallel to the X and Z axes) through which the robot must move so as to accurately relocate a wafer from the one station to the other.

This method may be employed both during initial setting up of the machine and also at frequent intervals during the life of the machine to enable a check to be made on the alignment and relative positioning of the inspection station and the grinding station.

The method may further comprise a learning step in which the robot is adjusted under manual control from a first position in which the holding means is aligned with the inspection station, to a second position in which the holdings means is aligned with the grinding chuck, and during this mode, the movements of the robot along at least its X and Z axes as well as its Y axis, are noted and stored in a memory associated with a computer controlling the robot, and subsequent automatic operation thereof is effected by instructing the computer to follow a path determined by the co-ordinates stored in the said memory so as to replicate the movements previously effected under manual control.

The manually inputed start and finish positions can be corrected using the method described above, and the true positions of the inspection station axis of rotation and the grinding chuck axis of rotation can be substituted for the approximate positions obtained under manual control.

By "manual control" is meant manually moving the robot through a prescribed path with the relevant robot drives disabled except in so far as encoders associated therewith are still operable to indicate the movement of the robot.

"Manual control" is also intended to include within its ambit the possibility of taking over the control of the robot by a manually controlled device such as a keyboard or joystick or other control, and with the drives to tho robot operational, adjusting the position of the robot using its drives first of all so as to align the holding means with a vacuum chuck in the inspection station, and thereafter aligning the holding means with a vacuum chuck in the grinding station. In each case the encoded signals from the various drives are used in known manner to define the co-ordinate positions of the robot at different times and to record the shifts parallel to the X, Y and Z robot axes.

In order to facilitate manual control, switch means may be provided, under the control of the operator, to enable the latter to identify to the computer when the workpiece holding means is approximately aligned with each of the two points, ie. the inspection chuck axis and the grinding chuck axis. The same switch means may be employed to record the co-ordinates of different way-points throughout the movement of the robot.

The inspection station may also include means for determining the thickness of the workpiece (wafer), and this additional information can be used to make precise adjustments to the axial movement of a machining tool such as a grooved grinding wheel for engaging an edge of the workpiece at the workstation.

The optical inspection device is preferably located at the inspection station with its optical axis parallel to the Y axis (ie. the axis of rotation of the workpiece in the inspection station), and preferably with the two axes in the same horizontal plane.

Where workpiece diameter can vary, Vernier means if preferably provided for adjusting the position of the optical inspection device so as to accommodate any substantial differences in diameter between workpieces.

The optical inspection device preferably comprises a CCD camera the lens of which forms and optical image of the edge of the disc on the CCD chip. Means for illuminating the edge region of the disc viewed by he camera may be provided so that the edge region viewed by the cameras is backlit, and is therefore viewed by the latter in silhouette.

The CCD array typically contains a large number of pixels in a rectangular array. Typically and addressable array of 768×576 pixels is employed.

Electric circuit means receptive of signals obtained by scanning the CCD array in manner known per se, may be adapted to convert the signal from each pixel in the CCD array into a digital value according to whether a pixel is shaded by the image of the disc edge or not.

For a fixed number of pixels, the degree of digitisation of each pixel signal value determines up to a point the accuracy of the inspection system.

By storing each frame in succession, so it is possible to compare pixel dependent signals from one frame to the next, and to determine from that comparison change in the value of the pixel dependent signal from one frame to the next, indicative of any shift in the position of the image of the edge brought about by movement of the edge of the disc in the field of view due to eccentric mounting of the disc for rotation.

The edge of the disc appears as a transition between light and dark and therefore the pixel dependent signal varies from one extreme value to its other extreme value, as between shading and no shading.

In a simple arrangement in which the output from each pixel is digitised as a binary signal and is either high or low, the maximum resolution may be as low as the size of one pixel.

If the pixel signals are digitised on a scale from n=A (corresponding to a fully shaded (black) spot) to n=B (where B corresponds to no shading), digital analysis can be applied to more accurately determine where the edge of the disc image lies in relation to the pixels, since if this happens to bisect a pixel (as can occur) the particular value of n, attributable to a bisected pixel on the scale A→B, will indicate the percentage of the pixel which is covered by the disc image (and therefore shaded) and the percentage which is unshaded.

In an arrangement in which the pixel resolution is such that an "edge" can be "seen" in the values of a number of adjoining pixels, signals corresponding to pixels are preferably interrogated in groups simultaneously, single "rogue" values (attributable inter alia to noise etc.) are disregarded, and the true edge is identified as being where a majority of the adjoining pixel signal values indicate it to be. In this case the actual position of the edge can be identified as being midway between the last pixel having a value of B on one side of the transition and the first pixel to have the value A on the other side of the transition, being the position at which the signal value is nearest the arithmetic mean of the pixel signal values A and B.

By taking into account the focal length of the lens employed, the size of the CCD array and the number and therefore size of the pixels, so a scaling factor can be determined for a given camera/lens combination, by which an apparent shift of the "true" edge by $x$ pixels can be equated to a linear distance of $r$ mm.

The advantage of the invention is most readily realised if the angular orientation of the disc can be determined, with reference to a fixed point around its circumference, such as a notch, or a flat, or the disc has applied to the viewed surface a small distinguishable mark/spot or a machine detectable marking, such as a magnetic patch. The rotated position of the disc can then be determined by visual or camera inspection or by a suitable sensor such as a magnetic sensor, as appropriate.

By rotating the disc, the mark (eg notch) will at some stage cross the field of view of the camera. A particular signal pattern will be generated, and signal processing and computing apparatus supplied with the camera output can be programmed to look for that pattern and note the angular position of the disc, from an encoder associated with the disc drive.

As the disc is rotated, any misalignment between the geometric centre of the disc and its axis of rotation in the inspection station, will appear as a shift of the image of the disc on the CCD.

By noting the value of the shift as a plurality of angularly spaced positions determined by the encoder, it is possible to compute the X Z coordinates $(X_1 Z_1)$ geometric centre of the disc.

Since the X,Z coordinates $(X_2 Z_2)$ of the axis of the vacuum chuck at the inspection station are known, and that is the axis about which the disc is actually rotating, the shift in X and Z needed to align the geometric centre with the vacuum check axis at a particular edge of the inspection station can be computed from $(X_1-Z_2)$, $(Y_1-Z_2)$.

Since the X,Z coordinates of the workstation chuck $(X_3 Y_3)$ to which the disc is to be transported are also known, it is a simple matter to determine the distances through which the disc must be moved parallel to the X and Z axes after leaving the inspection station chuck so as to align its geometric centre with the axis $(X_3 Z_3)$ at the workstation.

A second camera may be positioned so as to view the edge of the disc tangentially, with the optical axis of the camera in or parallel to the plane of the disc. This permits the profile of the edge of the disc to be inspected to an enlarged scale by displaying an enlarged image of what the camera sees on a CRT.

Theoretically it should be possible to simply take the video signal from a CCD camera and display this on a CRT in a closed circuit television link.

In practice the image of the edge in such an arrangement is very obscure since the camera has to be located a considerable distance from the point on the periphery at which the optical axis intersects the disc edge, and which is to be brought into focus, and a considerable part of the edge of the disc will be in the field of view and will contribute to the image on the CCD chip.

In particular, since this unwanted part of the edge of the disc in the field of view of the camera will be closer to the lens than the region of interest, the image of this unwanted part of the disc will tend to appear larger than the region of interest, and attempts to obviate the problem by using a lens with a short depth of focus have not been successful.

It has been found that this problem can be corrected optically by using a Telecentric lens such as supplied by Melles Griot of Cambridge, England, which produces an in focus image to the same size of objects at different distances from the lens.

Preferably however not is the camera fitted with a Telecentric lens, but the electrical signals from the camera are subjected to processing such as aforesaid before the camera signal is used to generate a display on a CRT, and in this way the image of the edge profile of the CRT is sharp and unaffected by the presence of the disc between the region of interest and the camera.

The invention therefore also lies in a combination of a telecentric lens, a CCD camera, digitisation of the video signal and signal processing as aforesaid and the display of the processed signal on a computer monitor as opposed to processing and displaying the video signal from the camera in a closed circuit television system.

Measurements may be made on the digital video signal using the described numerical analysis techniques so as to obtain measurement of the image produced on the CCD camera.

In order to facilitate the signal processing and enhancement of the representation of the edge profile in the final CRT display, the video signal obtained by reading the pixels of the CCD chip are preferably digitised and stored in a frame store and the digital values in the frame store are processed, and re-stored, either in a second frame store, or by replacing the values in the original frame store, and the representation of the wafer edge in the computer display is obtained by appropriately addressing the store containing the processed values.

The profile of the disc can be checked at a number of points around the circumference and this can be achieved either by rotating the disc between a number of stationary positions and exposing an image of the edge of the disc to the camera chip at each position and storing the processed signal from each said stationary position, or alternatively the camera may be operated so as to produce a video signal corresponding to each of a succession of images as the disc rotates, each of which corresponds to the profile of a different region of the disc measured circularly around its circumference.

The camera shutter may be operated in synchronism with the rotation of the disc to obtain this, or instead the camera may be set to take a larger number of high speed exposures as the disc rotates.

The invention will now be described with reference to the accompanying drawings in which.

Figures 6, 7:
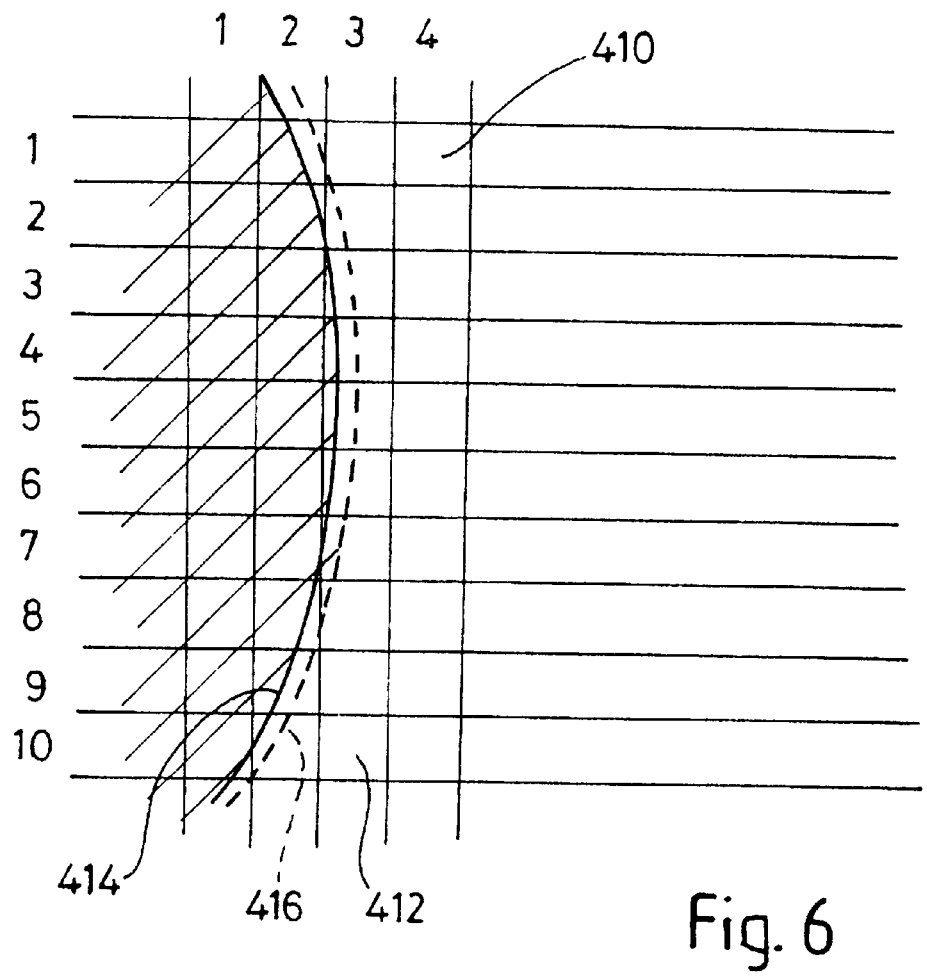
FIG. 6 illustrates how the image of the edge region of a circular disc intersects pixels in a CCD camera chip.

FIG. 7 is a table showing digital values in the range 1–10 attributable to different pixels in the 4 columns and 10 rows of FIG. 6;

FIG. 8 is a table showing revised values of signal values for FIG. 7;

FIG. 9 illustrates the image present on the CCD camera chip of a wafer edge; and FIG. 10 is a diagrammatically illumination signal processing system.

Figure 1:
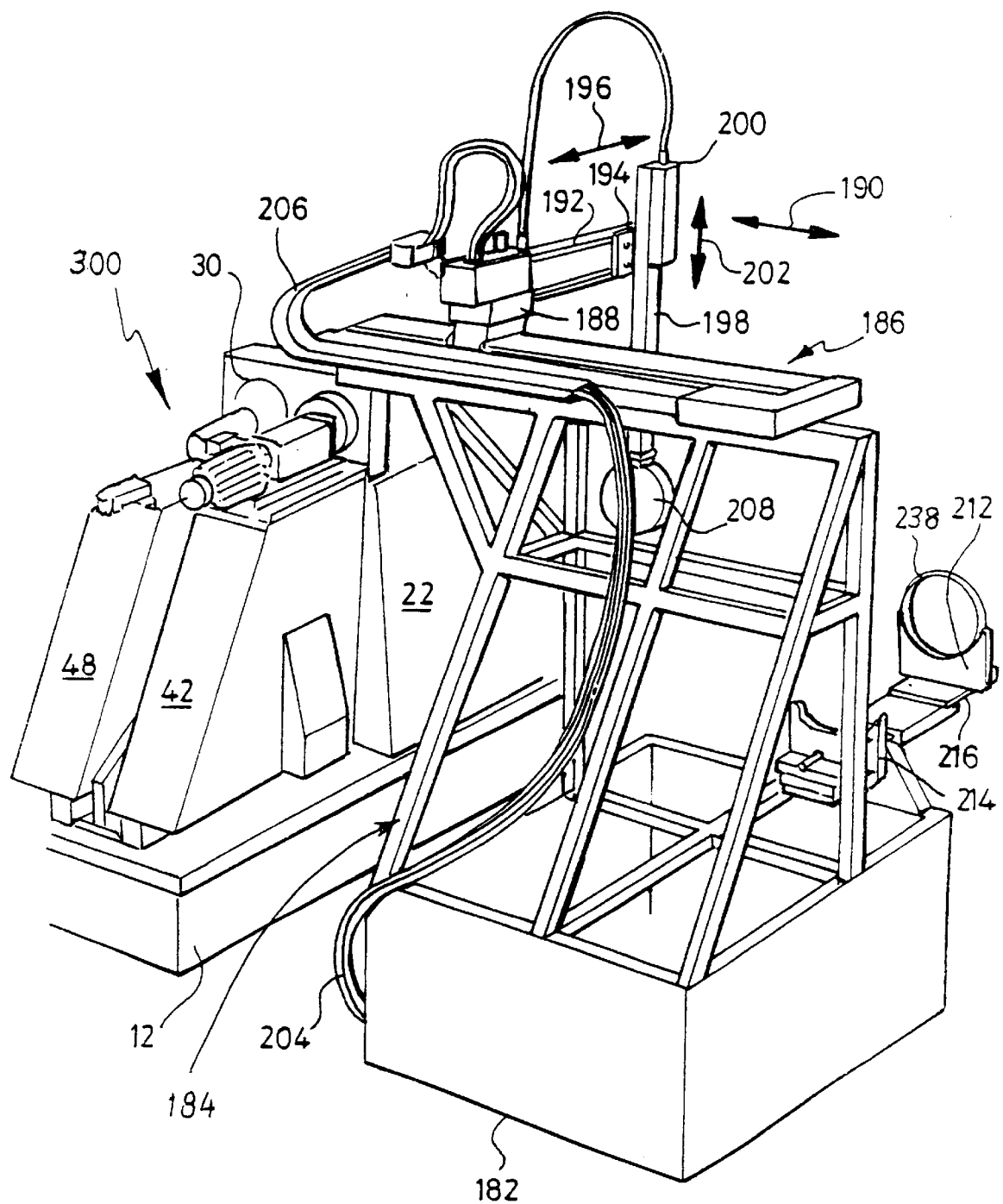
FIG. 1 is a perspective view of a circular disc loading and unloading mechanism which is adapted to be mounted to one side of a grinding machine.

FIG. 1 shown a robotic system for handling circular plate-like wafers of silicon typically 100 or 200 mm diameter or larger. The system comprises a base 182 and structural framework generally designated 184 extending upwardly therefrom to provide a support for a linear slideway generally designated 186 along which a carriage housing 188 can slide in the direction of the arrow 190. A second slide 192 protrudes from the housing 188 at right angles to the slideway 186 and a sliding member 194 is adapted to move therealong in the direction of the arrow 196. An arm 198 protrudes from the member 194 and a drive attached thereto and shown at 200 provides for movement of the arm 198 in the direction of the arrow 202. Electric power for the drive 200 and the drives in the housing 188 is provided via a multi-way umbilical 204 which is retained in the flexible safety harness 206 attached to the linear track 186.

At the lower end of the arm 198 is a vacuum chuck 208 and by suitable manoeuvring of the carriages 188 and 200 and the arm 198, so the vacuum chuck 208 can be positioned in front of a wafer or disc workpiece 238 which is held upright in a supporting sleeve 212. An empty supporting sleeve at 214 is also shown ready to receive a processed wafer.

After a machining operation in machine 300 a finished wafer workpiece 238 can be picked up from the workstation, and to this end the transfer mechanism of FIG. 1 is operated so as to position the chuck 208 opposite the wafer 238 on the workhead, so as to retrieve the finished wafer 238 and transfer this to the empty sleeve 214.

Movement of the carriage 194 further out towards the sleeve 212 positions the chuck 208 in front of an unground workpiece 238, and after picking this up, it can be transferred into the inspection station and thereafter to the machining environment of the machine 300 for attachment to the vacuum chuck on the workhead in place of the previous wafer for grinding.

It will be appreciated that a plurality of sleeves can be provided on the track 216 and all the workpieces located therein can be removed, centred, ground, inspected and returned thereto in turn.

Wafer Centering

Figure 2:
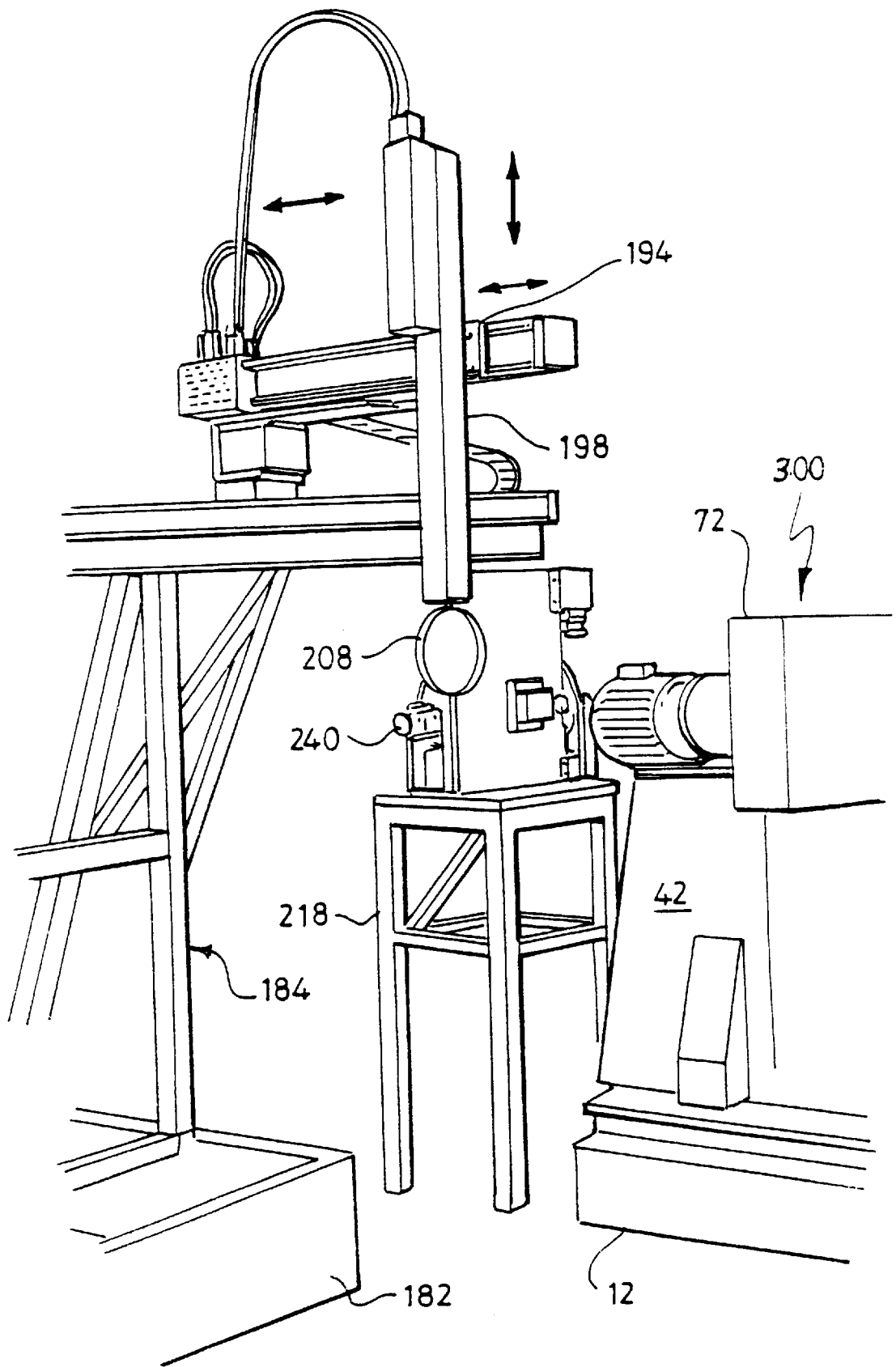
FIG. 2 is an opposite perspective view of the loading and unloading mechanism of FIG. 1 which also shows disc inspection apparatus.
Figure 3:
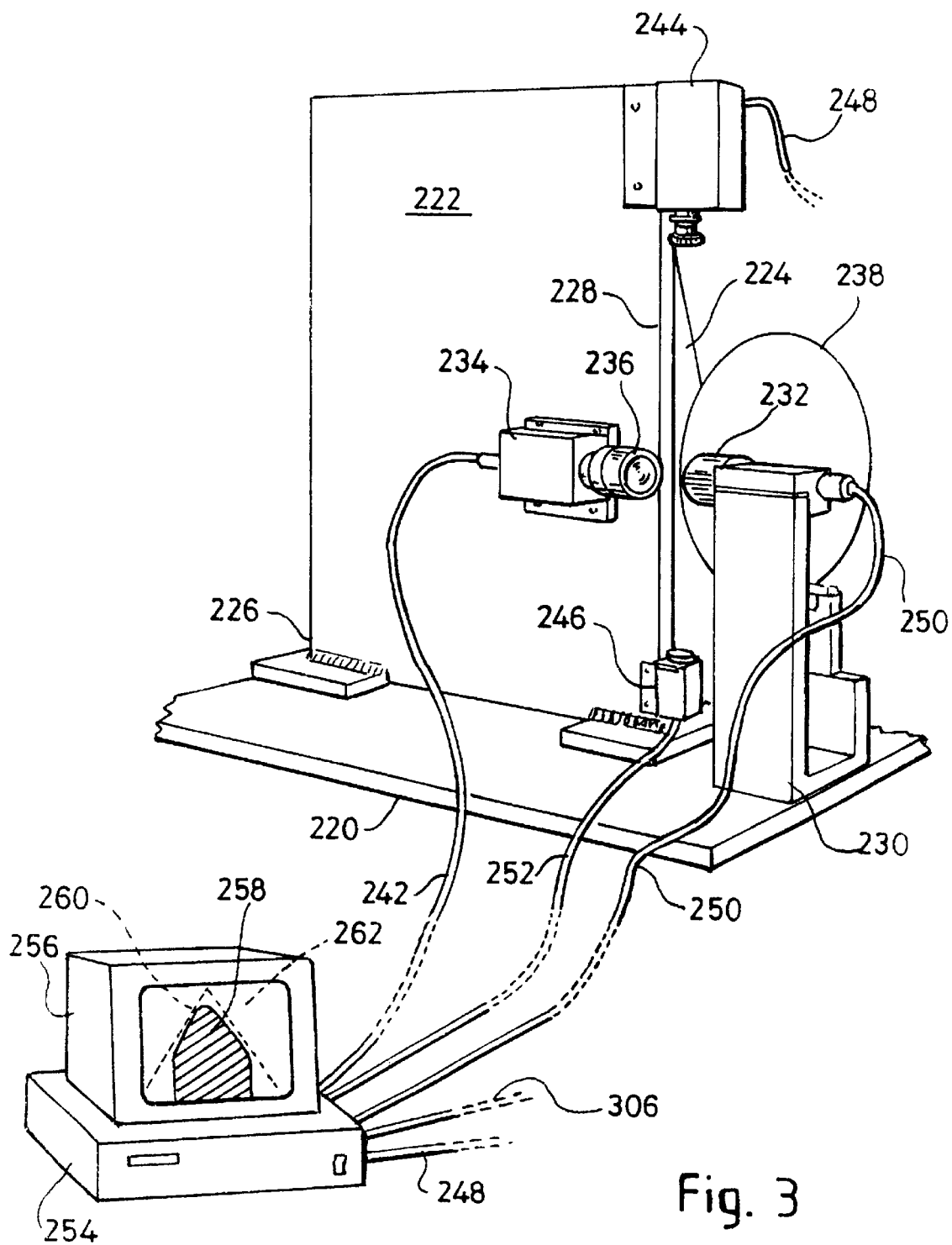
FIG. 3 is a perspective view from the opposite end of the disc inspection apparatus shown in FIG. 2, to an enlarged scale.

As an intermediate step before grinding, (preferably during the grinding of another wafer), each of the wafers is positioned in the inspection apparatus shown in FIGS. 2 and 3, to enable the geometric centre of the wafer to be determined, and thereby allow it to be accurately positioned on a chuck 30 for grinding. After grinding, the wafer may again be located for inspection of the edge profile of the wafer before it is returned to its storage sleeve.

FIG. 2 is an overall showing where the inspection apparatus sits in relation to the grinding machine 300 and the robotic wafer handling system of FIG. 1. As before the same reference numerals are used throughout.

The inspection apparatus comprises a stand 218 on which is located a support framework which comprises a base 220 and an upright plate 222 (see FIG. 3). A triangular stiffening plate 224 extends from the rear of the plate 222 and both 222 and 224 are welded to the plate 220 as at 226.

As seen in FIG. 2, a motor 240 is mounted on the rear of the plate 222. The motor drives a vacuum chuck on which the disc 238 which is to be inspected is planted by the vacuum chuck 208 of arm 198.

Rotation of the motor 240 rotates the wafer 238. By positioning this so that the edge intersects the field of view of the camera lens 236 electrical signals can be derived from the camera output for feeding via a cable 242 to signal analysis apparatus for processing data obtained from the signals.

A second camera 244 may be mounted on the support plate edge 228, with its optical axis tangential to the disc 238 (or at least parallel to the tangent thereto), to view the edge of the disc 238 generally tangentially, so as to obtain information on the profile of the edge. The disc edge is backlit by lamp 246 and signals from the camera 24 are supplied along cable 248. Power for the lamps 232 and 246 is supplied as required along cables 250 and 252 respectively.

A computer 254 is supplied with signals from the cameras 234 and 244 via cables 242 and 248 and controls the cameras and their lamps 232 and 246 via return signal paths along 242 and 248 and via cables 250 and 252 respectively. The output of camera 244 can be displayed on a monitor 256 as required. The profile of the edge of the wafer 238 is shown at 258 together with a computer generated template 260, 262 showing eg the ideal angle for the sides of the profile.

Centering Workpiece Onto Grinding Machine Work Spindle

This is achieved using the technique described hereinafter using the robotic wafer handling and inspection system of FIGS. 1 to 3, using signals from camera 234 obtained as the circular workpiece wafer is rotated through its field of view.

Figure 4:
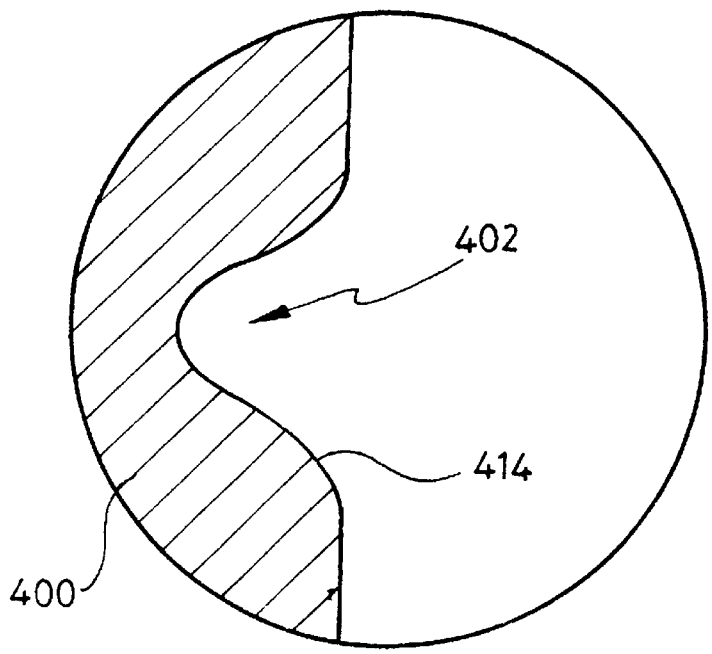
FIG. 4 illustrates the image presented to a CCD camera chip when a notch in the periphery of a circular disc occupies the field of view of the camera.

In FIG. 4 the shaded region 400 corresponds to the silhouette image of the disc 238 as seen by the CCD chip in the camera 234, where the disc has been rotated so that a notch 402 in its edge lies in the camera field of view.

Figure 5:
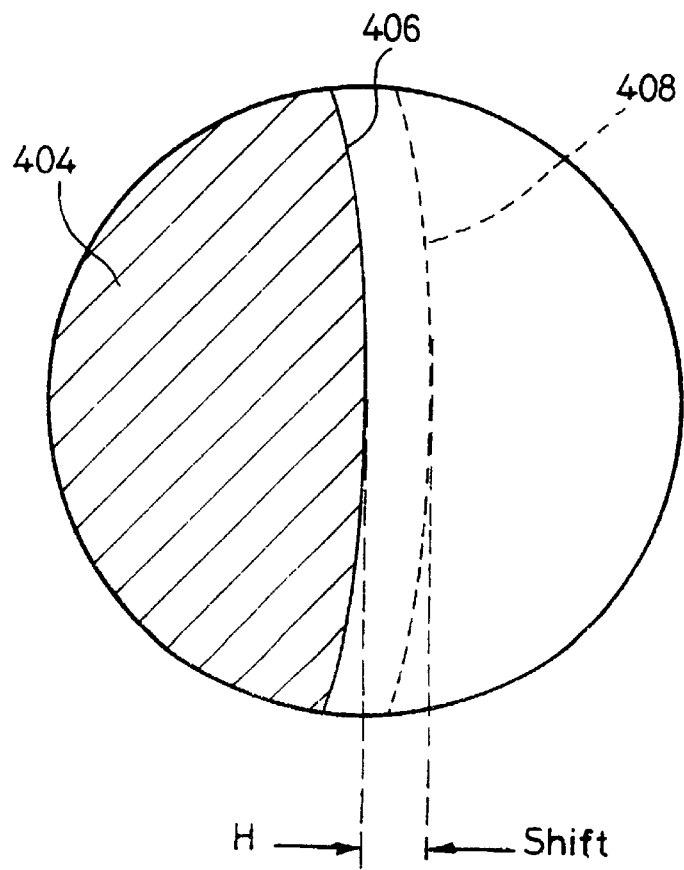
FIG. 5 illustrates how the image of the disc will shift across the field of view of a distance H due to any misalignment of the geometric centre of the disc with the axis about which the disc is being rotated, as it is viewed by the camera.

In FIG. 5 the shaded area 404 likewise corresponds to the silhouette image of the disc 238 as seen by the CCD chip, but this time with the notch out of the field of view of the camera.

Since the notch only occupies a tiny percentage of the circumference of the disc, for the majority of the time the image presented to the camera chip will be as shown in FIG. 5. However if the disc is mounted off-centre, the eccentric movement of the disc will cause the edge 406 of the shaded region to move over the surface of the CCD chip. The solid line 406 corresponds to the position of the image of the disc edge on the CCD chip in a position where the geometric centre of the disc has been rotated until it is displaced to the left of the axis about which the disc is being rotated, and the dotted outline 408 shows the position of the line 406 after the disc has rotated through 180°, so that the geometric centre (and therefore the image of the disc) has now shifted to the right.

The shift H shown in FIG. 5 is equal to twice the eccentricity of the disc where the eccentricity equals the distance between the centre of geometry of the disc and the centre about which the disc is being rotated.

In practice the value of H will be small but it is usually important that when the disc is mounted for machining, the geometric centre of the disc is co-incident with the axis about which the disc is rotated for machining purposes, or is displaced by a known amount along a given radius, relative to the machining axis, to accommodate a damaged region of the disc edge and allow regrinding of the disc.

The present method and apparatus enables the geometric centre of the disc to be determined very accurate by noting the angular positions of the disc relative to the notch at which the various displacements of the image edge occur, and computing H (and therefore ½ H).

The technique is simplified if the optical axis of the camera (and therefore the centre of the CCD chip) is in the same horizontal plane as the axis about which the disc is rotated. This ensures that however the disc is misaligned, shift of the position of the image edge on the CCD chip will be in a horizontal sense. This is shown in FIG. 5.

However if the camera does not "see" the maximum and minimum points of the eccentricity, the apparent shift will not be horizontal. In this event it is necessary for the image analysis software to make a best fit of the viewed images to a sine wave and then calculate the eccentricity of the wafer.

If the plane containing the axis of rotation and the optical axis of the camera is not horizontal, it is merely necessary to take this into account when computing the results since the distance H measured in a horizontal sense will not then be precisely equal to twice the eccentric shift between the two centres.

Although the edge of the disc is curved, the size of the CCD chip in the camera will be very small relative to the circumference of the disc, and although the line 406 has been shown as curved in FIG. 5, the curvature will be barely visible in the image on the CCD chip and the curvature in the drawing has been exaggerated. Provided the mechanism for moving the wafer and locating it on the workhead can do so very accurately, the accuracy with which the disc is located at the machining station will be dependent at least in part on the accuracy to which the dimension H can be measured.

The camera chip can be thought of as a rectilinear array of light sensitive devices closely packed and arranged in rows and columns. FIG. 6 shows part of such an array and illustrates four of the columns and ten of the rows of such an array.

The individual pixels contribute to the resolution in both the row and column direction and are made as small as possible. Typically a camera chip having a diameter of approximately 1 cm will have in excess of 100,000 such light sensitive elements (or pixels as they are commonly called), and it is not uncommon for the number of pixels to exceed 300,000 or more.

For simplicity, the pixels in FIG. 6 will be identified by reference to the row and column they occupy so that the pixel identified by reference numeral 410 can be described as pixel 4:1, and the pixel designated by reference numeral 412 can therefore be described as pixel 3:10.

If the diameter of the disc is of the order of 100 mm or 200 mm (as is conventionally the case of silicon discs for the semi-conductor industry), the curvature of the line 412 in FIG. 6 will be barely discernable relative to the matrix of rows and columns of pixels. However if we consider the curvature in the region of the notch for example the knuckle 414 in FIG. 4, the curvature of the silhouette image in the region of the knuckle 414 might well equate to that shown in FIG. 6.

The mechanism of a CCD chip is such that at the beginning of each exposure period, all of the pixels are equally electrically charged. The array of pixels is then exposed to a pattern of light for a brief period of time and at the end of that period each of the pixels is inspected very rapidly and an electrical signal is generated for each of the pixels, the value of which is determined by the amount of charge needed to replace any which has dissipated during the exposure interval.

The light sensitive elements are such that during the exposure period, if no light has fallen on a pixel, the charge at the end of the exposure period should be substantially the same as that at the beginning. The value of the electrical signal during read-out for such a pixel will therefore be high and might be digitised to a value 10.

On the other hand if a pixel has been exposed to some light during the exposure interval, some of the charge will have become dissipated and the charge required to replenish the pixel to its original charge will generate an electrical signal the value of which is dependent upon the amount of charge which has to be supplied to replenish that which has been lost due to exposure to light.

If more than a certain quantity of light falls on a pixel during the exposure period, the original charge will be substantially dissipated and any light level above that threshold will not increase the electrical signal for that pixel during read-out. For this reason the quantity of light falling on the pixel array is controlled using an iris or neutral density filter and/or appropriate lighting, so that saturation as it is called does not occur. This means that the electrical signal value for each pixel during read-out will be proportional to the quantity of light which has fallen on the pixel during the exposure interval.

The exposure interval is very short and the time to read out the pixels can be a tiny fraction of the exposure interval and typically a chip can be exposed and read out 50 times a second, although higher rates are possible.

By using a conventional shutter synchronised to the operation of the chip or more preferably an electronic shutter implemented by the electrical operation of the chip, so movement of an object is effectively arrested as far as each exposure is concerned.

The electrical signal obtained during each read-out and generated by the electrical current needed to reinstate each pixel change can thus vary from 0 (for a pixel such as 1:1) to a maximum value (say 10) for an unshaded pixel such as 3:1. In the case of a pixel which is partly shaded and partly unshaded, such as 2:1, the amount of light falling thereon will be less than that of 3:1 and more than that of 1:1. If 50% of the pixel area is shaded, then approximately 50% of the light which would have produced a signal value of 10 on a read-out will have been received by the pixel during the exposure interval, and the digitised electrical signal value typically will be 5 when that pixel is read out.

FIG. 7 shows a table of typical digitised valued of the electrical signal during read-out of the pixels in the array shown in FIG. 6.

The arrangement of rows and columns in the table of FIG. 7 are transposed relative to the position of the rows and columns in FIG. 6, merely for convenience.

If during a subsequent exposure interval, the image of the disc has moved to the right so that the edge 414 is now in the position shown by the dotted line 416 in FIG. 6, the values in the table of FIG. 7 will be different, and might be as shown in FIG. 8.

Since it is the lateral displacement of the line 414 across the array of pixels which is of interest, the electrical signal from each read-out of the array must be interpreted so as to determine how far to the right the edge of the image has moved and therefore which of the columns has been intercepted. Since at the pixel level, the edge of the image may not be a sharp continuous line such as shown in FIG. 6, and because of electrical imperfections and so-called electrical noise, low value signals can be obtained during read-out ever from pixels which have been fully shaded, it is usually necessary to apply a so called threshold to the signal value before a decision is taken as to whether or not the image of the disc edge has invaded a particular column of pixels or not. This can be done by disregarding and digitised pixel signal value equal to or greater than 5, and equating that to a pixel on which no light has fallen and treating all pixels for which the digitised output signal is less than 5 as having been fully exposed and therefore having a value of 10.

As applied to FIG. 6, this means that pixel 1:2 would be disregarded, whereas pixel 2:2 would be treated as being "the disc". Pixels 3, 4, 5 and 6 in column 2 are all wholly shaded and the signal value for all of those is shown as 0. However in the simple thresholding situation described, the partial invasion column 3 by the edge of the disc would not be taken into account at all since none of the signal values in column 3 are below 5.

Using this approach, the maximum accuracy in the horizontal direction is therefore equal to the size of one pixel. Whilst this can be very small, it is nevertheless not necessarily accurate enough to allow the centre of the disc to be accurately located at the machining.

Merely raising the threshold will not help since this means that eventually pixels such as 3:3 will be treated as disc.

A more accurate assessment of the position of the edge 414 can be made since if the actual digitised values are taken into account.

The main problem is that small changes in value from 10 to 9 or 8, (such as for pixel 3:3, could be confused as or by electrical noise.

Since noise tends to be random and short-lived "rogue" low value signals can be isolated and ignored be considering whether or not there is any change occurring along the line or down the column which indicates that the small value is in line with the change or not. Thus if a random noise signal producing a small change in value of pixel 4:2 (say to 8 or 9) was to occur, the preceding pixel can be seen to have a value of 10 and unless the next pixel along the line has a value less than that of 4:2 the reduction in signal formed in pixel 4:2 can be disregarded.

On the other hand the small change in value as between pixel 2:3 and pixel 3:3, is followed in column 4 by a pixel having a very low or zero value. In this event, the signal value in column 3 at row 3 can be considered to be a valid signal and can be taken into account.

It will be see that column 4 is the first column containing all high values at column 1 contains pixels all having zero or very low values and column 2 has generally low values in the region of the higher value signals in column 3.

Looking row by row, the precise position of the edge in for example row 4, can be said to be 20% across the width of pixel 3:4 measured from the left hand edge of the pixel.

As will be seen from the dotted line 416, at the end of the next exposure interval, due to the eccentric movement of the disc, the edge could now be said to perhaps be 50% across the width of pixel 3:4.

Since the size of each pixel is known from the geometry of the chip, sub-pixel accuracy of the position of the edge can therefore be determined reasonably accurately even in the presence of electrical noise signals.

To do so the digitised video signal values must therefore be considered in groups simultaneously a decision taken to reject or allow through small changes for consideration depending on whether or not the small change is sandwiched between two low values or two high values, or in between a high and a low value. Only in the latter event would the intermediate signal value be retained for influencing the decision on the final position to be attributed to the disc edge.

The same procedure can be adopted for pixels in adjoining rows. In this event if the process was exclusive, the signals finally available for evaluation would have lost the contribution from pixel 3:3, but the value from pixel 3:4 would be available as would also that of 3:5, so that a relatively accurate assessment of the horizontal position of the edge 414 could still be made using the digitised signal values from pixels 3:4 and 3:5.

A similar technique can be employed in connection with signals obtained from the second camera 244 shown in FIG. 1 which is set to view the edge of the disc.

Ideally the tangential view of the edge profile should be as shown in FIG. 9 where the shaded area 417 of the circular field of view is and idealised representation of the edge of the disc in silhouette. The edge profile of the disc is typically evaluated in person by the operator although automation may be possible.

In practice the image of the edge is not as shown in FIG. 9, but is very obscure since the camera has to be located a considerable distance from the point on the periphery at which the optical axis intersects the disc edge, is to be brought into focus, and a considerable part of the edge of the disc (see 239 in FIG. 10), will be in the field of view and will contribute to the image on the CCD chip.

This unwanted part 239 of the disc will tend to appear larger than and obscure the region of interest which is denoted by 241 in FIG. 10.

If a Telecentric lens such as supplied by Melles Griot of Cambridge, England, is used for the camera lens, it produces an in focus image to the same size of objects at different distances from the lens, and if the electrical signals from the camera are subjected to processing before they are used to generate a display on a visual display unit and image of the edge profile is obtained on the VDU which is sharp and clear, and unaffected by the presence of the disc between the region of interest and the camera.

Typically a Hitachi KPM1 camera is used which has a chip which will allow a 768×576 pixel read out resolution.

FIG. 10 shows diagrammatically the signal processing and enhancement of the representation of the edge profile for display on a VDU display. The video signal is obtained by reading the pixels of the CCD chip of camera 244. The camera output is digitised and stored in a first frame store 420. The digital values in the frame store are processed by processor 420 using a computer programme stored in memory 424, and re-stored in a second frame store 426. A representation of the wafer edge in a computer VDU display is obtained by addressing the second frame store 426 via the computer bus 428 and video driver 430 for producing RGB signals for a VDU 432.

The profile of the disc can be checked at a number of points around its circumference by rotating the disc between a number of stationary positions and exposing an image of the edge of the disc to the camera chip at each position and storing and processing the signal from each said stationary position of the disc. Alternatively the camera may be operated so as to produce a video signal corresponding to each of a succession of images as the disc rotates continuously each image corresponding to the edge profile of a different region of the disc measured circularly around its circumference. To this end the camera shutter may be operated in synchronism with the rotation of the disc to obtain this effect or the camera may be set to take a large number of high speed exposures as the disc rotates.

What is claimed is:

1. A machine for edge grinding circular workpieces, comprising workpiece holding means for attachment to the face of a workpiece to move the latter from one position to another, robotic means controlling the position of the workpiece holding means and adapted to move in at least two orthogonal directions, both of which are parallel to the plane of the workpiece when it occupies an optical inspection station, means for rotating the workpiece in the inspection station and in a machining station, inspection means for determining the position of the geometric centre of the workpiece as it is rotated in the first station, and computing means for calculating from data delivered by the inspection means any shifts required along the orthogonal directions of movement of the robotic means, to move the geometric centre of the workpiece to a second desired position whose coordinates are known, the optical inspection means comprising a CCD camera having its optical axis parallel to the axis of the workpiece and which forms an optical image of the edge of the workpiece of the CCD chip, and means for illuminating the edge region of the disc for viewing by the camera in silhouette, wherein the CCD array contains a large umber of addressable pixels in a rectangular array.

2. A system as claimed in claim 1, further comprising electric circuit means receptive of signals obtained by scanning the CCD array, adapted to convert the signal from each addressed pixel in the CCD array into a digital value according to whether a pixel is shaded by the image of the disc edge or not.

3. A system as claimed in claim 1, wherein for a fixed number of pixels, the degree of digitisation of each pixel signal value determines the accuracy of the inspection system.

4. A system as claimed in claim 1 further comprising means for storing each frame in succession, means is provided by which it is possible to compare pixel dependent signals from one frame to the next, further means is provided to determine from that comparison any change in the value of the pixel dependent signal from one frame to the next, thereby to produce a signal indicative of any shift in the position of the image of the edge brought about by movement of the edge of the disc in the field of view due to eccentric mounting of the disc for rotation.

5. A system as claimed in claim 4, wherein the edge of the disc appears as a transition between light and dark in the image presented to the CCD camera, and therefore the pixel dependent signal varies from one extreme value to its other extreme value, as between shading and no shading.

6. A system as claimed in claim 5, wherein the pixel signals are digitised on a scale from n=A (corresponding to a fully shaded (black) spot) to n=B (where B corresponds to no shading), digital analysis is applied to more accurately determine where the edge of the disc image lies in relation to the pixels, whereby if this happens to bisect a pixel the particular value of n, attributable to bisected pixel on the scale A→B, will indicate the percentage of the pixel which is covered by the disc image (and therefore shaded) and the percentage which is unshaded.

7. A system as claimed in claim 6, wherein the pixel resolution is such that an "edge" can be "seen" in the values of a number of adjoining pixels, means is provided whereby signals corresponding to pixels are interrogated in groups simultaneously, pulse selection means identifies single "rogue" values (attributable inter alia to noise etc.) and these are removed from the signal and means is provided for determining the true edge as being where a majority of the adjoining pixel signal values indicate it to be.

8. A system as claimed in claim 1, wherein as the disc is rotated, any misalignment between the geometric centre of the disc and its axis of rotation in the inspection station, will appear as a shift of the image of the disc on the CCD.

9. A system as claimed in claim 8, further comprising means for storing the value of the shift at a plurality of angularly spaced positions determined by the encoder, and means for computing therefrom the X Z coordinates $(X_1 Z_1)$ of the geometric centre of the disc.

10. A system as claimed in claim 1, wherein a second camera is positioned so as to view the edge of the disc tangentially, with the optical axis of the camera in or parallel to the plane of the disc, to permit the profile of the edge of the disc to be inspected to an enlarged scale by displaying an enlarged image of the optical image presented to the camera on a CRT.

11. A system as claimed in claim 10, wherein the second camera displays a Telecentric lens which produces an in focus image to the same size of objects over range of distances from the lens.

12. A system as claimed in claim 11, comprising in combination a telecentric lens, a CCD camera means for digitising the video signal from the camera and signal processing means for producing a signal for display on a computer monitor.

13. A machine for edge grinding circular workpieces, comprising workpiece holding means for attachment to the face of a workpiece to move the latter from one position to another, robotic means controlling the position of the workpiece holding means and adapted to move in at least two orthogonal directions, both of which are parallel to the plane of the workpiece when it occupies an optical inspection station, means for rotating the workpiece in the inspection station and in a machining station, inspection means for determining the position of the geometric centre of the workpiece as it is rotated in the first station, and computing means for calculating from data delivered by the inspection means any shifts required along the orthogonal directions of movement of the robotic means, to move the geometric centre of the workpiece to a second desired position whose coordinates are known, the optical inspection means comprising a CCD camera having its optical axis parallel to the axis of the workpiece and which forms an optical image of the edge of the workpiece on the CCD chip, and means for illuminating the edge region of the disc for viewing by the camera in silhouette, further comprising electric circuit means receptive of signals obtained by scanning the CCD array, adapted to convert the signal from each addressed pixel in the CCD array into a digital value according to whether a pixel is shaded by the image of the disc edge or not.

14. A system as claimed in claim 13, wherein for a fixed number of pixels, the degree of digitisation of each pixel signal value determines the accuracy of the inspection system.

15. A system as claimed in claim 13 further comprising means for storing each frame in succession, means is provided by which it is possible to compare pixel dependent signals from one frame to the next, further means is provided to determine from that comparison any change in the value of the pixel dependent signal from one frame to the next, thereby to produce a signal indicative of any shift in the position of the image of the edge brought about movement of the edge of the disc in the field of view due to eccentric mounting of the disc for rotation.

16. A system as claimed in claim 13, wherein as the disc is rotated, any misalignment between the geometric centre of the disc and its axis of rotation in the inspection station, will appear as a shift of the image of the disc on the CCD.

17. A system as claimed in claim 13, wherein a second camera is positioned so as to view the edge of the disc tangentially, with the optical axis of the camera in or parallel to the plane of the disc, to permit the profile of the edge of the disc to be inspected to an enlarged scale by displaying an enlarged image for the optical image presented to the camera on a CRT.

18. A machine foe edge grinding circular workpiece, comprising workpiece holding means for attachment to the face of a workpiece to move the latter from one position to another, robotic means controlling the position of the workpiece holding means and adapted to move in at least two orthogonal directions, both of which are parallel to the plane of the workpiece when it occupies and optical inspection station, means for rotating the workpiece in the inspection station and in a machining station, inspection means for determining the position of the geometric centre of the workpiece as it is rotated in the first station, and computing means for calculating from data delivered by the inspection means any shifts required along the orthogonal directions of movement of the robotic means, to move the geometric centre of the workpiece to a second desired position whose coordinates are known, the optical inspection means comprising a CCD camera having its optical axis parallel to the axis of the workpiece and which forms an optical image of the edge of the workpiece on the CCD chip, and means for illuminating the edge region of the disc for viewing by the camera in silhouette, wherein for a fixed number of pixels, the degree of digitisation of each pixel signal value determines the accuracy of the inspection system.

19. A system as claimed in claim 18 further comprising means for storing each frame in succession, means is provided by which it is possible to compare pixel dependent signals from one frame to the next, further means is provided to determine from that comparison any change in the value of the pixel dependent signal from one frame to the next, thereby to produce a signal indicative of any shift in the position of the image of the edge brought about by movement of the edge of the disc in the field of view due to eccentric counting of the disc for rotation.

20. A system as claimed in claim 18, wherein as the disc is rotated, any misalignment between the geometric centre of the disc and its axis of rotation in the inspection station, will appear as a shift of the image of the disc on the CCD.

21. A system as claimed in claim 18, wherein a second camera is positioned so as to view the edge of the disc tangentially, with the optical axis of the camera in or parallel to the plane of the disc, to permit the profile of the edge of the disc to be inspected to an enlarged scale by displaying an enlarged image of the optical image presented to the camera on a CRT.

22. A machine for edge grinding circular workpieces, comprising workpieces holding means for attachment to the face of a workpiece to move the latter from one position to another, robotic means controlling the position of the workpiece holding means and adapted to move in at least two orthogonal directions, both of which are parallel to the plane of the workpiece when it occupies an optical inspection station, means for rotating the workpiece in the inspection station and in a machining station, inspection means for determining the position of the geometric centre of the workpiece as it is rotated in the first station, and computing means for calculating from data delivered by the inspection means any shifts required along the orthogonal directions of movement of the robotic means, to move the geometric centre of the workpiece to a second desired position whose coordinates are known, the optical inspection means comprising a CCD camera having its optical axis parallel to the axis of the workpiece and which forms and optical image of the edge of the workpiece on the CCD chip, and means for illuminating the edge region of the disc for viewing by the camera in silhouette, further comprising means for storing each frame in succession, means is provided by which it is possible to compare pixel dependent signals from one frame to the next, further means is provided to determine from that comparison any change in the value of the pixel dependent signal from one frame to the next, thereby to produce a signal indicative of any shift in the position of the image of the edge brought about by movement of the edge of the disc in the field of view due to eccentric mounting of the disc for rotation.

23. A system as claimed in claim 22, wherein as the disc is rotated, any misalignment between the geometric centre of the disc and its axis of rotation in the inspection station, will appear as a shift of the image of the disc on the CCD.

24. A system as claimed in claim 22, wherein a second camera is positioned so as to view the edge of the disc tangentially, with the optical axis of the camera in or parallel to the plane of the disc, to permit the profile of the edge of the disc to be inspected to an enlarged scale by displaying an enlarged image of the optical image presented to the camera on a CRT.

25. A machine for edge grinding circular workpieces, comprising workpiece holding means for attachment to the face of a workpiece to move the latter from one position to another, robotic means controlling the position of the workpiece holding means and adapted to move in at least two orthogonal directions, both of which are parallel to the plane of the workpiece when it occupies an optical inspection station, means for rotating the workpiece in the inspection station and in a machining station, inspection means for determining the position of the geometric centre of the workpiece as it is rotated in the first station, and computing means for calculating from data delivered by the inspection means any shifts required along the orthogonal directions of movement of the robotic means, to move the geometric centre of the workpiece to a second desired position whose coordinates are known, the optical inspection means comprising a CCD camera having its optical axis parallel to the axis of the workpiece and which forms and optical image of the edge of the workpiece on the CCD chip, and means for illuminating the edge region of the disc for viewing by the camera in silhouette, wherein as the disc is rotated, any misalignment between the geometric centre of the disc and its axis of rotation in the inspection station, will appear as a shift of the image of the disc on the CCD.

26. A system as claimed in claim 25, wherein a second camera is positioned so as to view the edge of the disc tangentially, with the optical axis of the camera in of parallel to the plane of the disc, to permit the profile of the edge of the disc to be inspected to an enlarged scale by displaying an enlarged image of the optical image presented to the camera on a CRT.

27. A machine for edge grinding circular workpieces, comprising workpiece holding means for attachment to the face of a workpiece to move the latter from one position to another, robotic means controlling the position of the workpiece holding means and adapted to move in at least two orthogonal directions, both of which are parallel to the plane of the workpiece when it occupies and optical inspection station, means for rotating the workpiece in the inspection station and in a machining station, inspection means for determining the position of the geometric centre of the workpiece as it is rotated in the first station, and computing means for calculation from data delivered by the inspection means any shifts required along the orthogonal directions of movement or the robotic means, to move the geometric centre of the workpiece to a second desired position whose coordinates are known, the optical inspection means comprising a CCD camera having its optical axis parallel to the axis of the workpiece and which forms and optical image of the edge of the workpiece on the CCD chip, and means for illuminating the edge region of the disc for viewing by the camera in silhouette, wherein a second camera is positioned so as to view the edge of the disc tangentially, with the optical axis of the camera in or parallel to the plane of the disc, to permit the profile of the edge of the disc to be inspected to and enlarged scale by displaying an enlarged image of the optical image presented to the camera in a CRT.

* * * * *